(12) United States Patent
Chang et al.

(10) Patent No.: US 8,892,487 B2
(45) Date of Patent: Nov. 18, 2014

(54) ELECTRONIC SYNAPSES FOR REINFORCEMENT LEARNING

(75) Inventors: Leland Chang, New York, NY (US); Dharmendra S. Modha, San Jose, CA (US); Robert K. Montoye, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 12/982,505

(22) Filed: Dec. 30, 2010

(65) Prior Publication Data

US 2014/0310220 A1    Oct. 16, 2014

(51) Int. Cl.
 *G06F 15/18*    (2006.01)

(52) U.S. Cl.
 USPC .......................................................... 706/27

(58) Field of Classification Search
 USPC .................................................... 706/29, 27
 See application file for complete search history.

(56) References Cited

U.S. PATENT DOCUMENTS

| | | | |
|---|---|---|---|
| 5,274,748 A | 12/1993 | Boser et al. | |
| 5,299,286 A | 3/1994 | Imondi et al. | |
| 5,355,528 A * | 10/1994 | Roska et al. | 706/38 |
| 5,479,579 A * | 12/1995 | Duong et al. | 706/36 |
| 5,696,883 A | 12/1997 | Arima | |
| 5,781,702 A | 7/1998 | Alhalabi | |
| 6,199,057 B1 * | 3/2001 | Tawel | 706/30 |
| 6,829,598 B2 | 12/2004 | Milev | |
| 7,430,546 B1 | 9/2008 | Suri | |
| 7,533,071 B2 | 5/2009 | Snook et al. | |
| 7,599,895 B2 | 10/2009 | Nugent | |
| 8,103,602 B2 | 1/2012 | Izhikevich | |
| 2008/0140594 A1 * | 6/2008 | Tannhof et al. | 706/15 |
| 2008/0162391 A1 | 7/2008 | Izhikevich | |
| 2008/0275832 A1 | 11/2008 | McDaid et al. | |

(Continued)

FOREIGN PATENT DOCUMENTS

| | | |
|---|---|---|
| KR | 1020100129741 A | 12/2010 |
| WO | WO 94/14134 A1 | 6/1994 |
| WO | WO 2009/113993 A1 | 9/2009 |
| WO | WO2009113993 A1 | 9/2009 |

OTHER PUBLICATIONS

Xie, X., Seung, S. "Spike-Based Learning Rules and Stabilization of Persistent Neural Activity" Advances in Neural Information Processing Systems. MIT Press, 2000.*

(Continued)

*Primary Examiner* — Kakali Chaki
*Assistant Examiner* — Vincent Gonzales
(74) *Attorney, Agent, or Firm* — Kenneth L. Sherman, Esq.; Michael Zarrabian, Esq.; Sherman & Zarrabian LLP

(57) ABSTRACT

Embodiments of the invention provide electronic synapse devices for reinforcement learning. An electronic synapse is configured for interconnecting a pre-synaptic electronic neuron and a post-synaptic electronic neuron. The electronic synapse comprises memory elements configured for storing a state of the electronic synapse and storing meta information for updating the state of the electronic synapse. The electronic synapse further comprises an update module configured for updating the state of the electronic synapse based on the meta information in response to an update signal for reinforcement learning. The update module is configured for updating the state of the electronic synapse based on the meta information, in response to a delayed update signal for reinforcement learning based on a learning rule.

25 Claims, 15 Drawing Sheets

(56) References Cited

U.S. PATENT DOCUMENTS

2009/0292661 A1   11/2009   Haas
2009/0313195 A1   12/2009   McDaid et al.
2010/0223220 A1    9/2010   Modha et al.
2010/0241601 A1*  9/2010   Carson et al. .................. 706/27

OTHER PUBLICATIONS

Lu, B., Yamada, W., and Berger T. W. "Asymmetric Synaptic Plasticity Based on Arbitrary Pre- and Postsynaptic Timing Spikes Using Finite State Model" In Proceedings od International Joint Conference on Neural Networks, Orlando, Florida, USA, Aug. 12-17, 2007.*

Schemmel, J., Bruderle, D., Meier, K., and Ostendorf, B., "Modeling Synaptic Plasticity within Networks of Highly Accelerated I&F Neurons" IEEE International Symposium in Circuits and Systems, (ISCAS) 2007.*

R. Florian, "Reinforcement learning through modulation of spike-timing-dependent synaptic plasticity", Neural Computations vol. 19, pp. 1-36, 2007.*

Mitra, S., "Learning to Classify Complex Patterns Using a VLSI Network of Spiking Neurons," MTech Microelectronics, Indian Institute of Technology, 2008, pp. i-147, Bombay, India.

Oster, M. et al., "A Hardware/Software Framework for Real-Time Spiking Systems," 2005 International Conference on Artificial Neural Networks (ICANN 2005), Lecture Notes in Computer Science, vol. 3696, Springer-Verlag, 2005, pp. 161-166, Berlin, Germany.

Gordon, C. et al., "An Artificial Synapse for Interfacing to Biological Neurons," Proceedings of the 2006 IEEE International Symposium on Circuits and Systems (ISCAS 2006), IEEE, 2006, pp. 1123-1126, United States.

White, M.H. et al., "Electrically Modifiable Nonvolatile Synapses for Neural Networks," 1989 IEEE International Symposium on Circuits and Systems, IEEE, May 1989, pp. 1213-1216, United States.

International Search Report and Written Opinion dated Nov. 17, 2011 for International Application No. PCT/EP2011/068183 from European Patent Office, pp. 1-12, Rijswijk, Netherlands.

Misra, J. et al., "Artificial neural networks in hardware: A survey of two decades of progress", Neurocomputing, Dec. 1, 2010, pp. 239-255, vol. 74, No. 1-3, Elsevier Science Publishers, Amsterdam, Netherlands.

Arthur J.V. et al., "Learning in Silicon: Timing is Everything", Advances in Neural Information Processing Systems 18, Brains in Silicon Group, Standford University, May 1, 2006, pp. 1-8, Standford University, United States.

Florian, R.V., "Reinforcement learning through modulation of spike-timing-dependent synaptic plasticity", Center for Cognitive and Neural Studies (Coneural), Sep. 27, 2006, pp. 1-30, Coneural, Romania.

Kawato, M. et al., "Efficient reinforcement learning: computational theories, neuroscience and robotics", Current Opinino in Neurobiology, ScienceDirect, Apr. 2007, pp. 205-212, Elsevier, Netherlands.

* cited by examiner

ELECTRONIC SYNAPSES FOR REINFORCEMENT LEARNING

This invention was made with Government support under HR0011-09-C-0002 awarded by Defense Advanced Research Projects Agency (DARPA). The Government has certain rights in this invention.

BACKGROUND

The present invention relates to neuromorphic and synapatronic systems, and in particular, producing spike-timing dependent plasticity in a synapse cross-bar array.

Neuromorphic and synapatronic systems, also referred to as artificial neural networks, are computational systems that permit electronic systems to essentially function in a manner analogous to that of biological brains. Neuromorphic and synapatronic systems do not generally utilize the traditional digital model of manipulating 0s and 1s. Instead, neuromorphic and synapatronic systems create connections between processing elements that are roughly functionally equivalent to neurons of a biological brain. Neuromorphic and synapatronic systems may be comprised of various electronic circuits that are modeled on biological neurons.

In biological systems, the point of contact between an axon of a neuron and a dendrite on another neuron is called a synapse, and with respect to the synapse, the two neurons are respectively called pre-synaptic and post-synaptic. The essence of our individual experiences is stored in conductance of the synapses. The synaptic conductance changes with time as a function of the relative spike times of pre-synaptic and post-synaptic neurons, as per spike-timing dependent plasticity (STDP). The STDP rule increases the conductance of a synapse if its post-synaptic neuron fires after its pre-synaptic neuron fires, and decreases the conductance of a synapse if the order of the two firings is reversed.

BRIEF SUMMARY

Embodiments of the invention provide electronic synapses configured for reinforcement learning. In one embodiment, an electronic synapse is configured for interconnecting a pre-synaptic electronic neuron and a post-synaptic electronic neuron. The electronic synapse comprises memory elements configured for storing a state of the electronic synapse and storing meta information for updating the state of the electronic synapse. The electronic synapse further comprises an update module configured for updating the state of the electronic synapse based on the meta information in response to an update signal for reinforcement learning. The update module is configured for updating the state of the electronic synapse based on the meta information, in response to a delayed update signal for reinforcement learning based on a learning rule.

In another embodiment, the invention provides a system, comprising a plurality of electronic neurons and a cross-bar array configured to interconnect the plurality of electronic neurons. The cross-bar array comprises a plurality of axons and a plurality of dendrites such that the axons and dendrites are transverse to one another. The cross-bar array further comprises multiple electronic synapses, wherein each electronic synapse is at a cross-point junction of the cross-bar array coupled between a dendrite and an axon, each electronic synapse configured for interconnecting a pre-synaptic electronic neuron and a post-synaptic electronic neuron.

These and other features, aspects and advantages of the present invention will become understood with reference to the following description, appended claims and accompanying figures.

DETAILED DESCRIPTION

Embodiments of the invention provide electronics synapses configured for reinforcement learning (RL). Embodiments of the invention further provide neuromorphic and synapatronic systems, including cross-bar arrays which implement spike-timing dependent plasticity (STDP), utilizing such electronics synapses for RL.

Figure 1A:
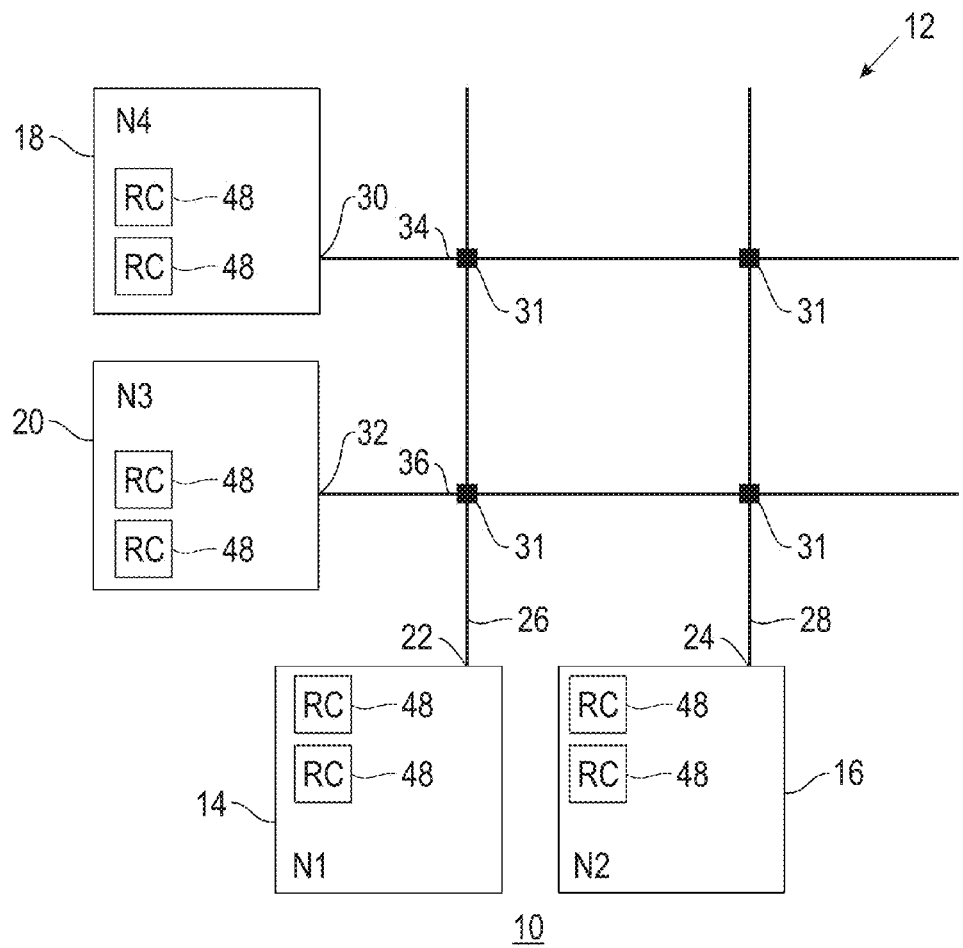
FIG. 1A shows a diagram of a neuromorphic and synapatronic system having a cross-bar array of electronic synapses, in accordance with an embodiment of the invention.

Referring now to FIG. 1A, there is shown a diagram of a neuromorphic and synapatronic system 10 having a cross-bar array in accordance with an embodiment of the invention. In one example, the cross-bar array may comprise an "ultra-dense cross-bar array" that may have a pitch in the range of about 0.1 nm to 10 μm. The neuromorphic and synapatronic system 10 includes a cross-bar array 12 having a plurality of neurons 14, 16, 18 and 20. These neurons are also referred to herein as "electronic neurons". Neurons 14 and 16 are axonal neurons and neurons 18 and 20 are dendritic neurons. Axonal neurons 14 and 16 are shown with outputs 22 and 24 connected to axon paths (axons) 26 and 28, respectively. Dendritic neurons 18 and 20 are shown with inputs 30 and 32 connected to dendrite paths (dendrites) 34 and 36, respectively. Axonal neurons 14 and 16 also contain inputs and receive signals along dendrites, however, these inputs and dendrites are not shown for simplicity of illustration. Thus, the axonal neurons 14 and 16 will function as dendritic neurons when receiving inputs along dendritic connections. Likewise, the dendritic neurons 18 and 20 will function as axonal neurons when sending signals out along their axonal connections. When any of the neurons 14, 16, 18 and 20 fire, they will send a pulse out to their axonal and to their dendritic connections.

Each connection between axons 26, 28 and dendrites 34, 36 are made through a synapse device 31. The junctions where the synapse device are located may be referred to herein as "cross-point junctions". Neurons 14, 16, 18 and 20 each include a pair of RC circuits 48. In general, in accordance with an embodiment of the invention, axonal neurons 14 and 16 will "fire" (transmit a pulse) when the inputs they receive from dendritic input connections (not shown) exceed a threshold. When axonal neurons 14 and 16 fire they maintain an A-STDP variable that decays with a relatively long, predetermined, time constant determined by the values of the resistor and capacitor in one of its RC circuits 48. For example, in one embodiment, this time constant may be 50 ms. The A-STDP variable may be sampled by determining the voltage across the capacitor using a current mirror, or equivalent circuit. This variable is used to achieve axonal STDP, by encoding the time since the last firing of the associated neuron, as discussed in more detail below. Axonal STDP is used to control "potentiation", which in this context is defined as increasing synaptic conductance.

When dendritic neurons 18, 20 fire they maintain a D-STDP variable that decays with a relatively long, predetermined, time constant based on the values of the resistor and capacitor in one of its RC circuits 48. For example, in one embodiment, this time constant may be 50 ms. In other embodiments this variable may decay as a function of time according to other functions besides an exponential curve. For example the variable may decay according to linear, polynomial, or quadratic functions. In another embodiment of the invention, the variable may increase instead of decreasing over time. In any event, this variable may be used to achieve dendritic STDP, by encoding the time since the last firing of the associated neuron, as discussed in more detail below. Dendritic STDP is used to control "depression", which in this context is defined as decreasing synaptic conductance.

Figure 1B:
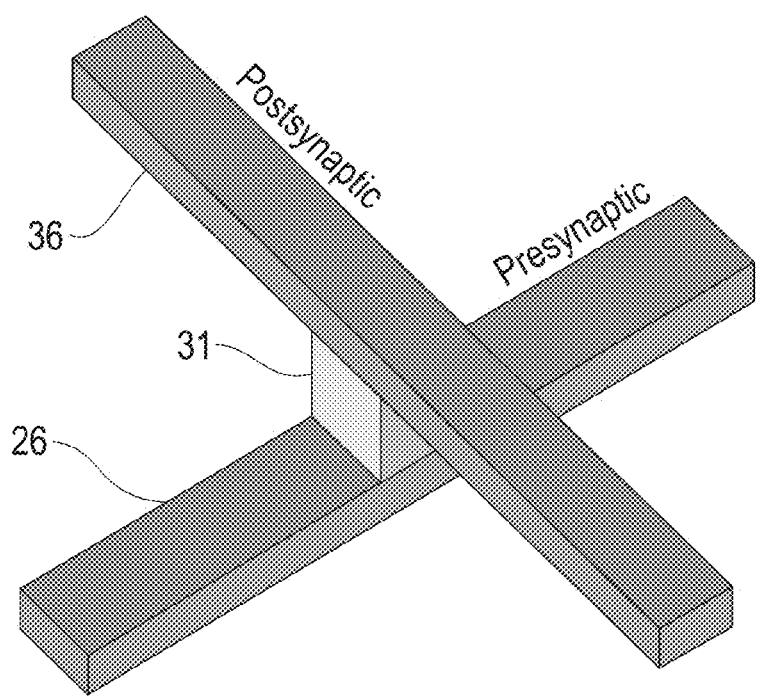
FIG. 1B shows a diagram of an electronic synapse at the cross-point junction of a pre-synaptic path and a post-synaptic path, in accordance with an embodiment of the invention.

The functions of an electronic synapse 31 include: read state, and program state according to STDP and RL-based STDP. The electronic synapse 31 is power efficient, which makes it suitable for asynchronous implementation. Further, the electronic synapse is space efficient, which makes it suitable for cross-bar implementation. FIG. 1B shows a perspective view of an electronic synapse 31 at the cross-point junction of a pre-synaptic path 26 and post-synaptic path 36, according to an embodiment of the invention.

Figure 2:
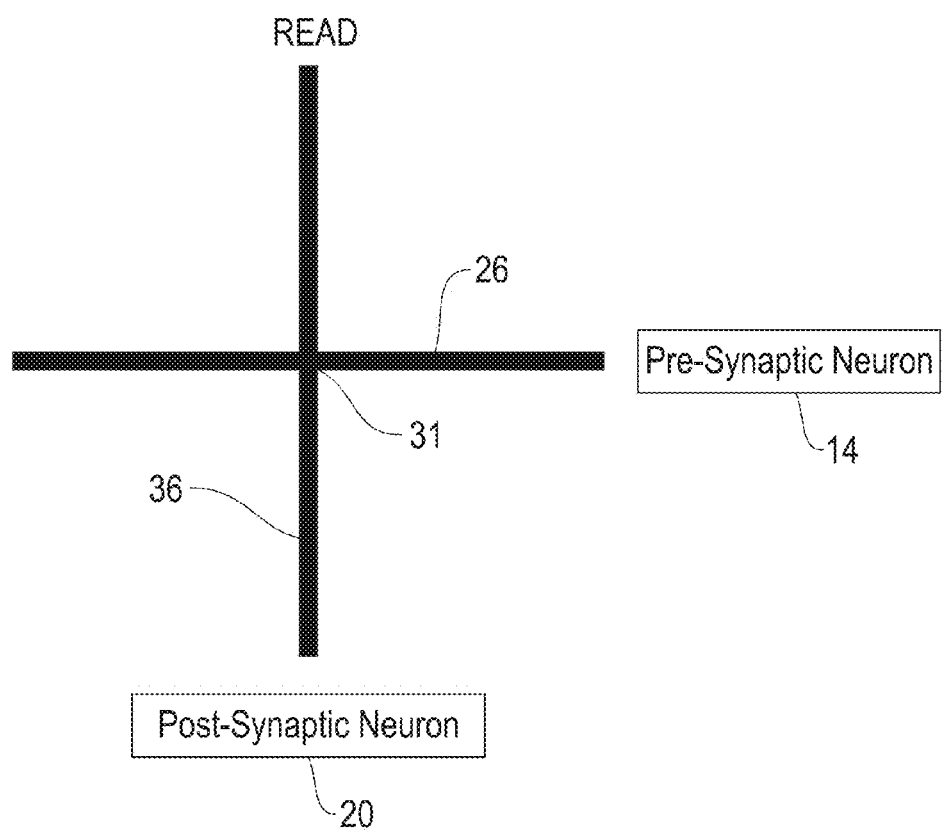
FIG. 2 shows a diagram of an electronic synapse at a cross-point junction involved in a read operation, in accordance with an embodiment of the invention.
Figure 3:
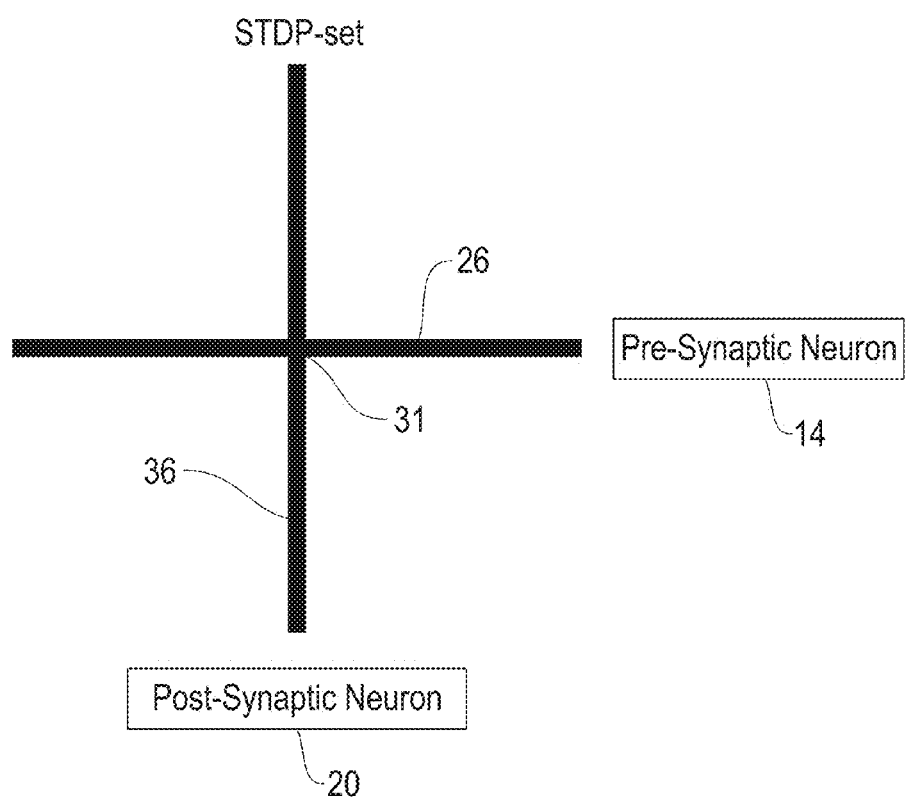
FIG. 3 shows a diagram of an electronic synapse at a cross-point junction involved in a STDP-set operation, in accordance with an embodiment of the invention.
Figure 4:
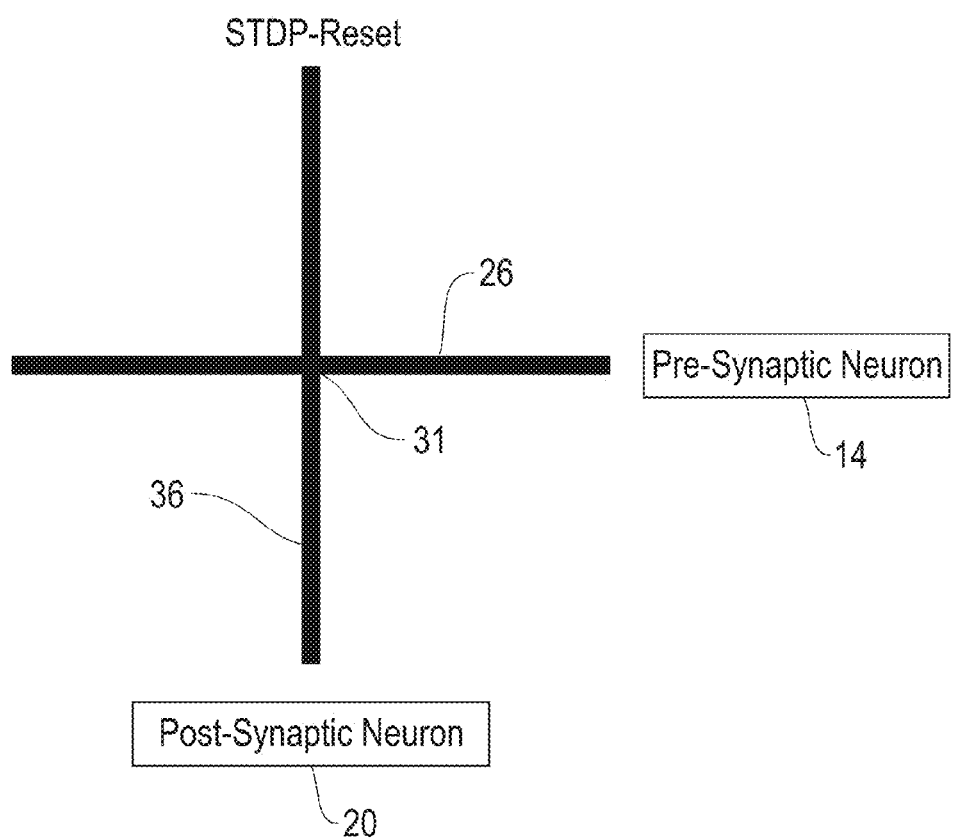
FIG. 4 shows a diagram of an electronic synapse at a cross-point junction involved in a STDP-reset operation, in accordance with an embodiment of the invention.

Referring to FIG. 2, with respect to a synapse 31 at the cross-point junction of contact between an axon 26 of a neuron 14 and a dendrite 36 on another neuron 20, the two neurons are respectively called pre-synaptic and post-synaptic. When the pre-synaptic neuron 14 fires, a "read" signal is sent from the pre-synaptic neuron 14 to the post-synaptic neuron 20. Referring to FIG. 3, when the pre-synaptic neuron 14 fires and then the post-synaptic neuron 20 fires, the synapse 31 is STDP-set. Referring to FIG. 4, when the post-synaptic neuron 20 fires and then the pre-synaptic neuron 14 fires, the synapse 31 is STDP-reset.

Reinforcement learning (RL) generally comprises learning based on consequences of actions, wherein an RL module selects actions based on past events. A reinforcement signal (e.g., a reward signal) received by the RL module is a reward (a numerical value) which indicates the success of an action. The RL module then learns to select actions that increase the rewards over time. In one implementation of reinforcement learning according to the invention, the STDP-set and STDP-reset operations do not take place immediately. Rather, if a reward ("value") signal occurs within a time window, then STDP-set or STDP-reset operations are applied.

According to an embodiment of the invention, the synapse 31 implements multiple information bits. In one example, according to an RGB scheme, the synapse 31 maintains three bits including a bit R, a bit G and a bit B. Bit R is for read, bit G is for STDP-set and bit B is for STDP-reset. Initially, bits G and B are set to 0 as their natural state. If the pre-synaptic neuron fires and then the post-synaptic neuron fires, then for STDP-set the bit G is set (e.g., set to 1). If post-synaptic neuron fires and then the pre-synaptic neuron fires, then for STDP-set the bit B is set (e.g., set to 1).

In one embodiment, the post-synaptic neuron fires and then the post-synaptic neuron fires, then STDP-reset is applied to bits B and G. For example, bits B and G are reset to 0 based on a time constant decay (e.g., 1 second). In another embodiment, resetting bits B and G comprises a random process resetting B and G, independent of neuron firing.

In one embodiment, bit R is set and reset when a reward occurs as follows:
  when a reward occurs:
    if G=1 and B=0, then set R,
    if B=1 and G=0, then reset R,
    if G=1 and B=1, or G=0 and B=0, take no action on R.

Figure 5:
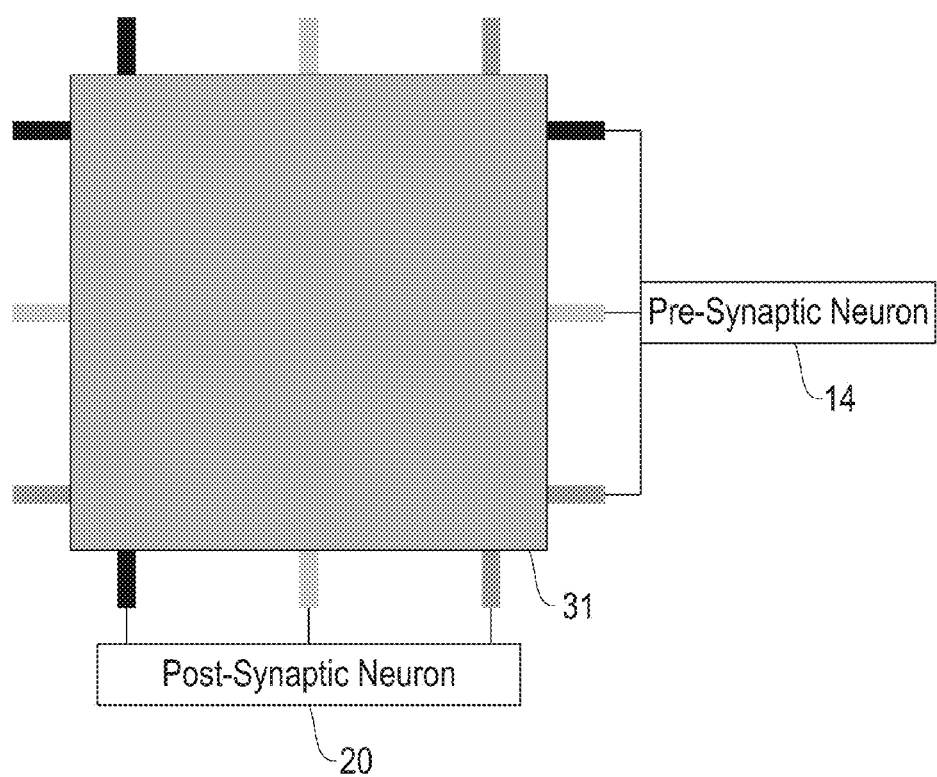
FIG. 5 shows a diagram of an electronic synapse at a cross-point junction involved in a STDP-set operation, in accordance with an embodiment of the invention.
Figure 6:
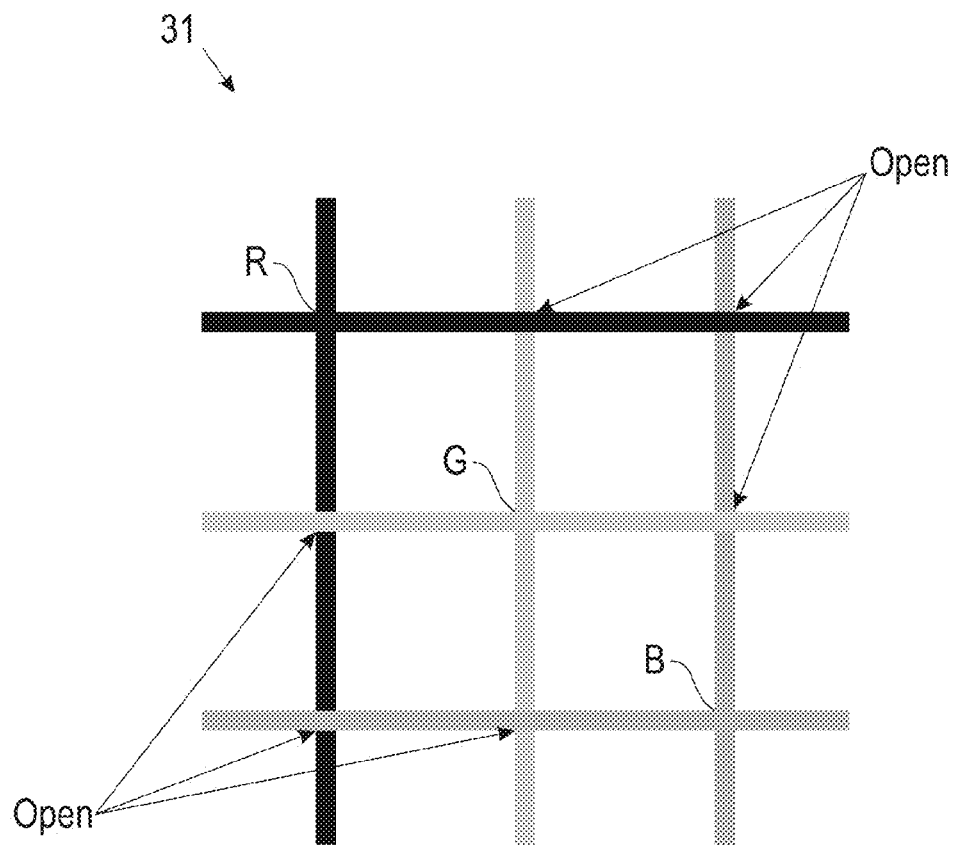
FIG. 6 shows a diagram of an electronic synapse including an array of junctions, in accordance with an embodiment of the invention.

Referring to FIG. 5, in one implementation, a synapse 31 comprises an n×n array of junctions. FIG. 6 shows an example synapse 31 comprising a 3×3 array of 9 junctions (n=3), wherein 3 diagonal junctions are used.

Figure 7:
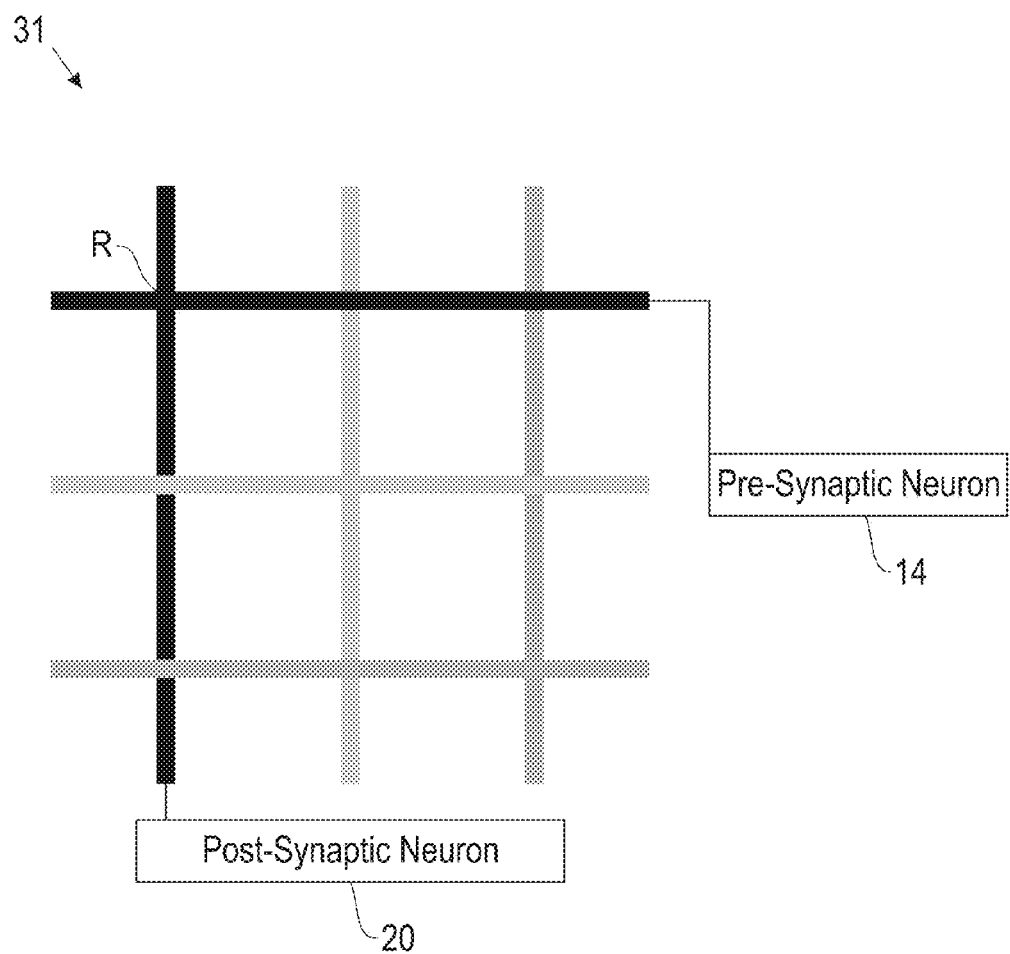
FIG. 7 shows a diagram of an electronic synapse involved in a STDP operation for an R bit, in accordance with an embodiment of the invention.

Logic for reading bit R is at the periphery of the synapse 31 as shown by example in FIG. 7, further illustrating reading bit R of the synapse 31, wherein when a pre-synaptic neuron fires, it sends a read pulse to the post-synaptic neuron. Then the post-synaptic neuron asynchronously reads the pulses as they arrive from the pre-synaptic neuron via R junction of the synapse 31. Logic for set/reset of bit R is contained within the synapse 31. In one implementation, bit R may be implemented using DRAM devices.

Figure 8:
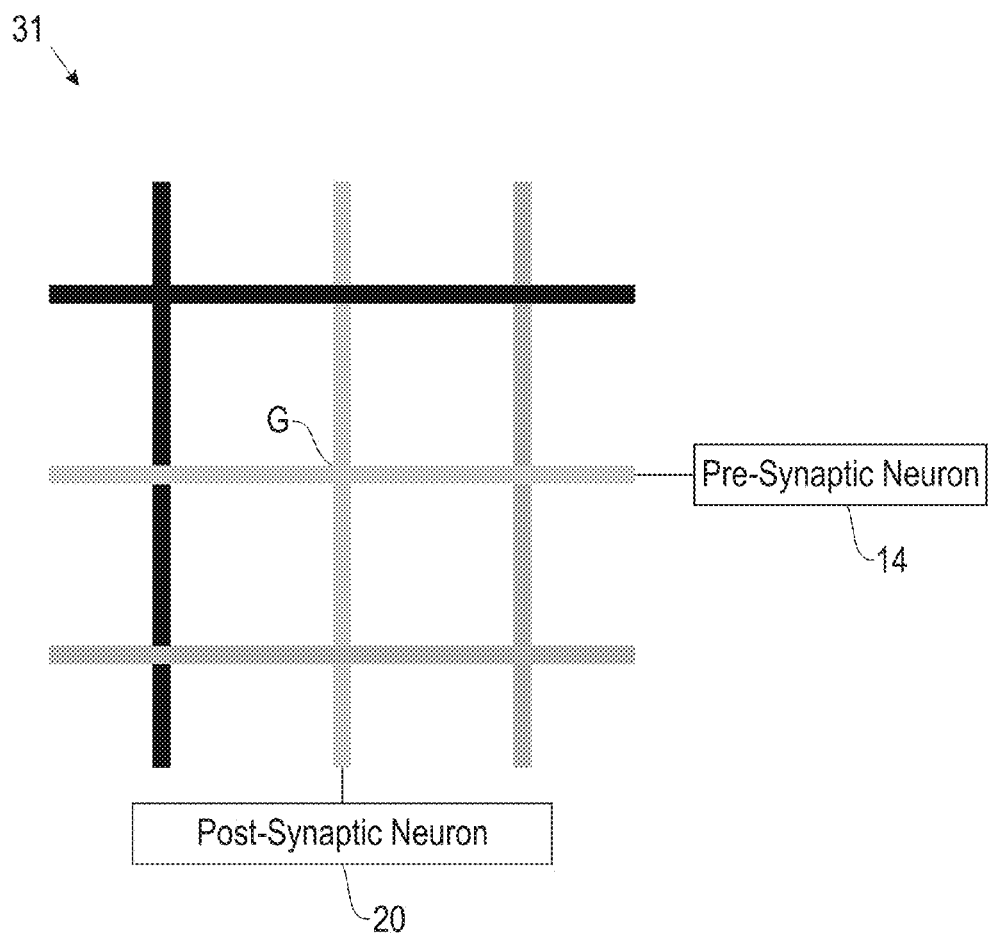
FIG. 8 shows a diagram of an electronic synapse involved in a STDP operation for a G bit, in accordance with an embodiment of the invention.

Logic for setting bit G is at the periphery of the synapse 31 as shown by example in FIG. 8, further illustrating setting bit G of the synapse 31, wherein when a post-synaptic neuron fires, it sends an alert pulse to the pre-synaptic neuron. Depending upon when it last fired, the pre-synaptic neuron probabilistically sets a pre-synaptic set pulse. The post-synaptic neuron always sends a post-synaptic set pulse. If both pre-synaptic set and post-synaptic set pulses arrive at the junction for bit G together, then bit G is set.

Further, logic for re-setting G is disposed at the periphery of the synapse 31. In one embodiment bit G has a preferred set value of zero, and resets after a certain time constant (for example, 1 sec). In another embodiment, re-setting G comprises a random stochastic process the resets bit G, in a fully asynchronous fashion, independent of firing of neurons. In one example, the process has a mean resetting time of about 1 second and has a heavy tail distribution. In one example, the reset of G is initiated by pre-synaptic neuron. In one implementation, bit G may be implemented using DRAM devices.

Figure 9:
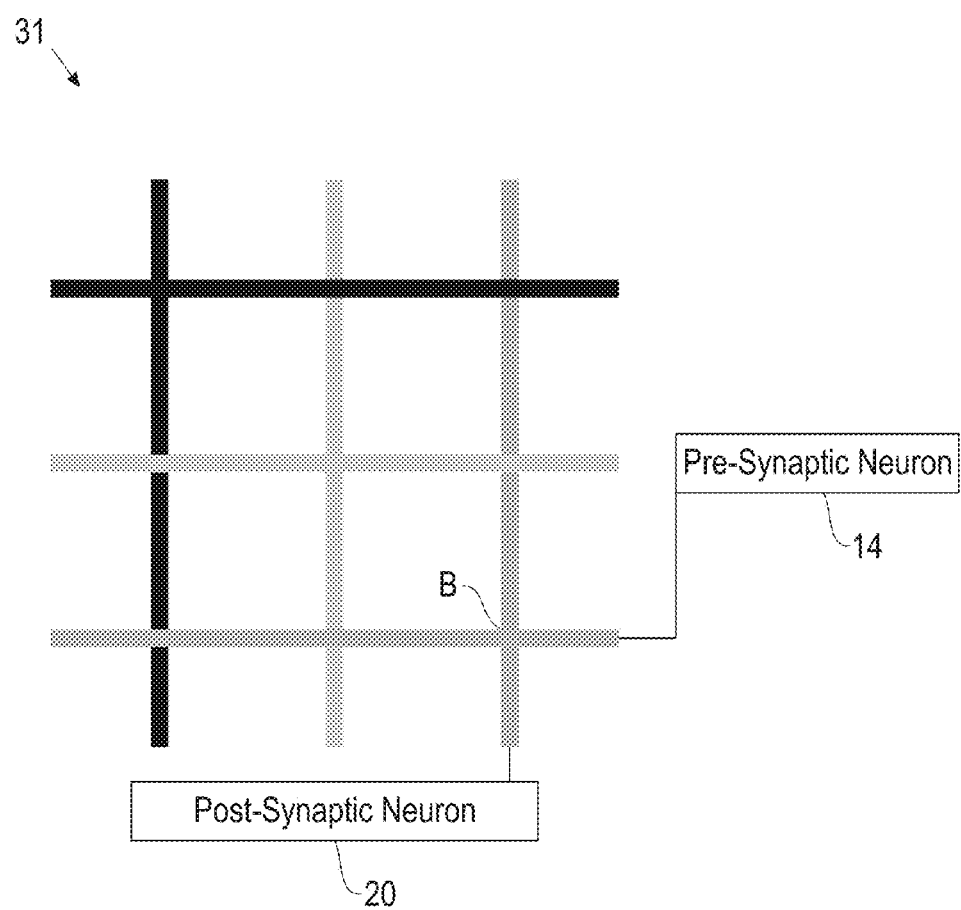
FIG. 9 shows a diagram of an electronic synapse involved in a STDP operation for a B bit, in accordance with an embodiment of the invention.

Logic for setting bit B is at the periphery of the synapse 31. Referring to FIG. 9, in one embodiment, if the post-synaptic neuron fires and then the pre-synaptic neuron fires, bit B is set. If the pre-synaptic neuron fires and then the post-synaptic neuron fires, bit G is set The pre-synaptic neuron, when it fires, alerts a post-synaptic neuron. Depending upon when it last fired, the post-synaptic neuron probabilistically sets a post-synaptic set pulse. Pre-synaptic neuron always sends a pre-synaptic set pulse. If both pre-synaptic pulse and post-synaptic set pulses arrive together at B bit, then bit B is set. Further, logic for re-setting B resides in the block 31. The bit B has a preferred set of zero and it simply resets after a certain time constant (e.g., about 1 sec). In another embodiment, a random stochastic process resets bit B, in a fully asynchronous fashion, and independent of firing of neurons. In one example, the process has a mean resetting time of about 1 second and has a heavy tail distribution. In one example, the reset is initiated by post-synaptic neuron. In one implementation, bit B may be implemented using DRAM devices.

Figure 10:
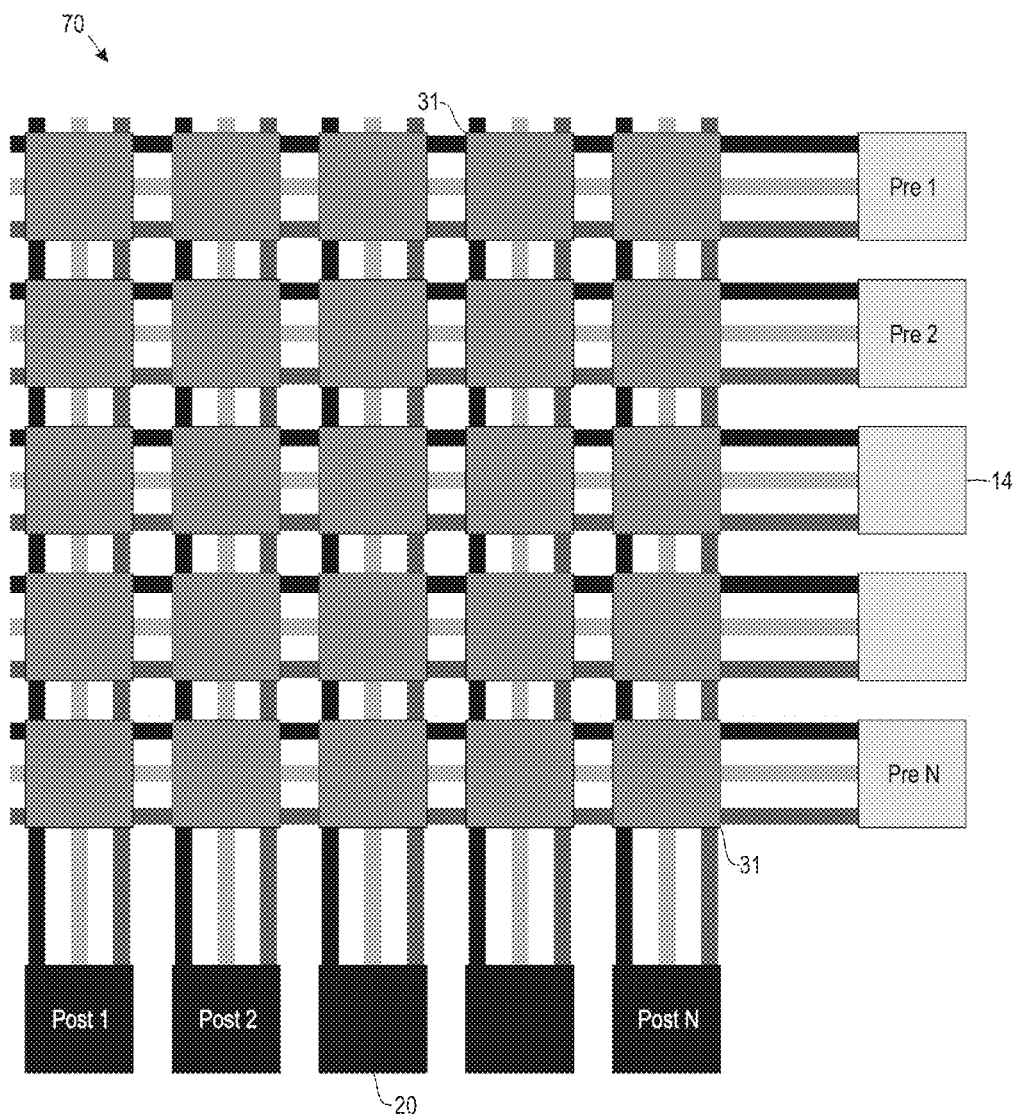
FIG. 10 shows a diagram of a cross-bar array of electronic synapses, in accordance with an embodiment of the invention.

Referring to FIG. 10, in one embodiment the present invention provides a system 70 for implementing electronic reinforcement learning synapses according to an embodiment of the invention is illustrated. The system 70 comprises an N×N cross-bar array of RGB synapse blocks 31 asynchronously operable in parallel (N rows and N columns). The system 70 further comprises N pre-synaptic neurons (e.g., Pre1, Pre 2, . . . , Pre N) and N post-synaptic neurons (e.g., Post1, Post 2, . . . , Post N), interconnected via the cross-bar array of synapses 31. In one implementation, each post-synaptic neuron 31 comprises an electronic mixed-mode (analog-digital) asynchronous neuron.

States are programmed according to STDP and RL-based STDP for asynchronous implementation. When a pre-synaptic neuron fires, a read signal is sent from the pre-synaptic neuron to a post-synaptic neuron that asynchronously reads the pulses as they arrive and probabilistically sets a pre-set pulse and always sets a post-set pulse.

In one embodiment of the invention, each electronic synapse 31 is configured for interconnecting a pre-synaptic electronic neuron and a post-synaptic electronic neuron. The electronic synapse 31 comprises memory elements (e.g., memory devices 31R, 31G, 31B in FIG. 11) configured for storing a state of the electronic synapse and storing meta information for updating the state of the electronic synapse. Each electronic synapse cell 31 further comprises an update module (e.g., module 31L in FIG. 11) configured for updating the state of the electronic synapse based on the meta information in response to an update signal for reinforcement learning. The update module is configured for updating the state of the electronic synapse based on the meta information, in response to a delayed update signal for reinforcement learning based on a learning rule.

Figure 11:
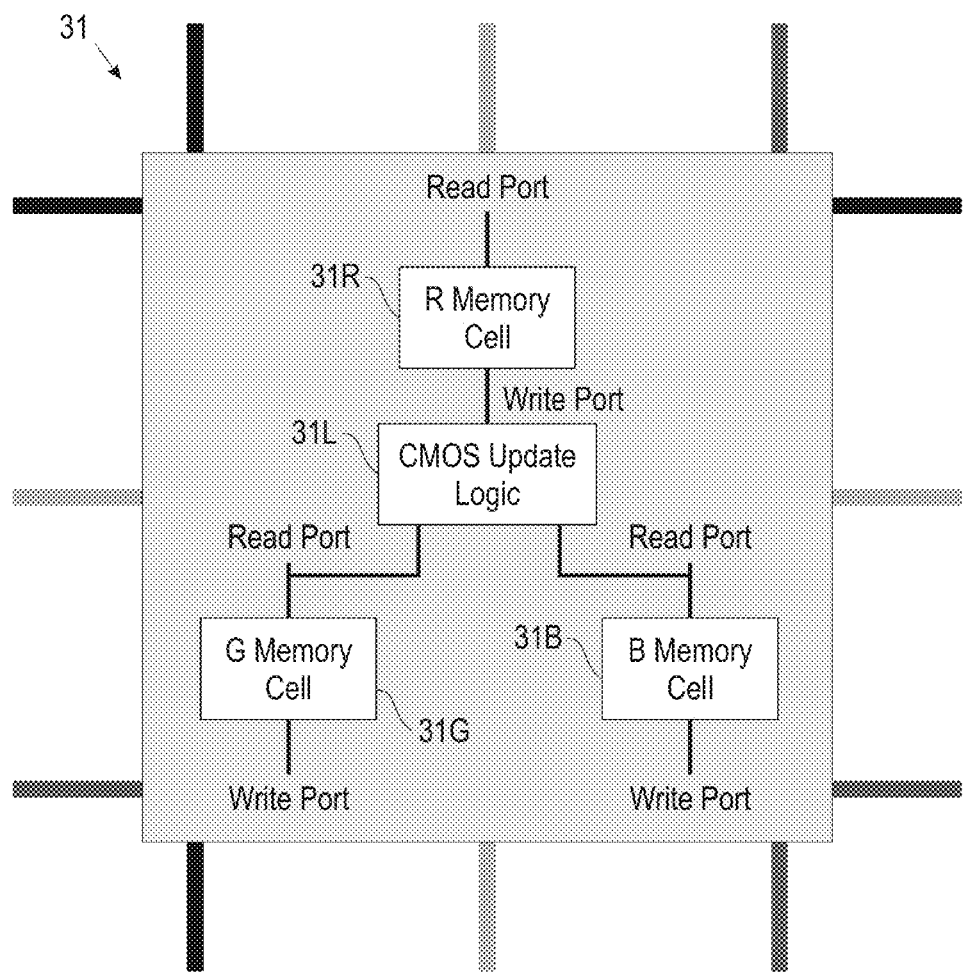
FIG. 11 shows a diagram of an electronic synapse, in accordance with an embodiment of the invention.

FIG. 11 illustrates an example implementation of an R, G, B synapse array 31 as a synapse cell (block) which can be operated in parallel with other synapse cells 31, without requiring phases (and without requiring time-division multiple access for read, set, and reset). Each synapse cell 31 can be operated completely asynchronously of other synapse cells 31, thus eliminating the need for a clock.

In one embodiment of the invention, each RGB synapse cell 31 comprises a digital complementary metal-oxide-semiconductor (CMOS) update logic 31L at the local synapse cell level can be used to write the R cell. In one implementation, the cell 31 comprises memory elements 31R, 31B, 31G for bits R, B and G, respectively. The memory elements can comprise static random access memory (SRAM), dynamic random access memory DRAM, Phase-change memory (PCM), magnetic tunnel junction (MTJ), etc. In this embodiment the synapse cell 31 comprises a space-division multiple access electronic synapse wherein the electronic synapse is represented as a 6-terminal device with two terminals for reading, two terminals for setting and two terminals for resetting.

In another embodiment of the invention, the update module 31L comprises a software module including computer readable program code to execute on a processor (e.g., information processing system 100 in FIG. 14), wherein the software module includes computer readable program code configured to update the state of the electronic synapse as described herein according to the embodiments of the invention.

The R memory cell maintains the state of the synapse. The G and B memory cells maintain meta information used for a subsequent update of the synapse. The neurons determine the read/write information for the memory cells. In FIG. 11, the synapse 31 provides a connection from a pre-synaptic neuron to a post-synaptic neuron which collaborate to activate the appropriate word line and bit lines to read/write the R, G and B memory cells. Neurons only write the G and B memory cells externally using Write ports. The G and B memory cells are read internally by the update logic 31L using Read ports to accordingly update the R memory cell. The R memory cell is read externally using a Read port and written (i.e., updated) internally by the update logic 31L using a Write port.

The state of the synapse can have one or more bits storing multiple values indicating level of conductivity of the synapse. In one embodiment, R memory cell stores state of the synapse, wherein the state of the synapse is a 1-bit synapse (0 for a conducting state indicating a connection, 1 for non-conducting state indicating no connection). A neuron can determine a connection through a synapse by reading the R memory cell. To update the R cell for a learning operation, the pre-synaptic neuron and the post-synaptic neuron coupled to the synapse implement a process to write the B and G memory cells for reinforcement learning. The neurons store update values into B and/or G memory cells using Write ports. Thereafter, an update value from the B or G memory cell is used to update the R memory cell as state of the synapse in response to an incoming reward signal. The R memory cell is updated with the value of the B memory cell or the value of the G memory cell depending on a later incoming reward signal as a reinforcement signal (delayed update), as described above. In one example, the STDP value is stored in a G or B memory cell, and at a later time the state of the synapse is updated by updating the R memory cell with the values from G or B cells.

Figure 12:
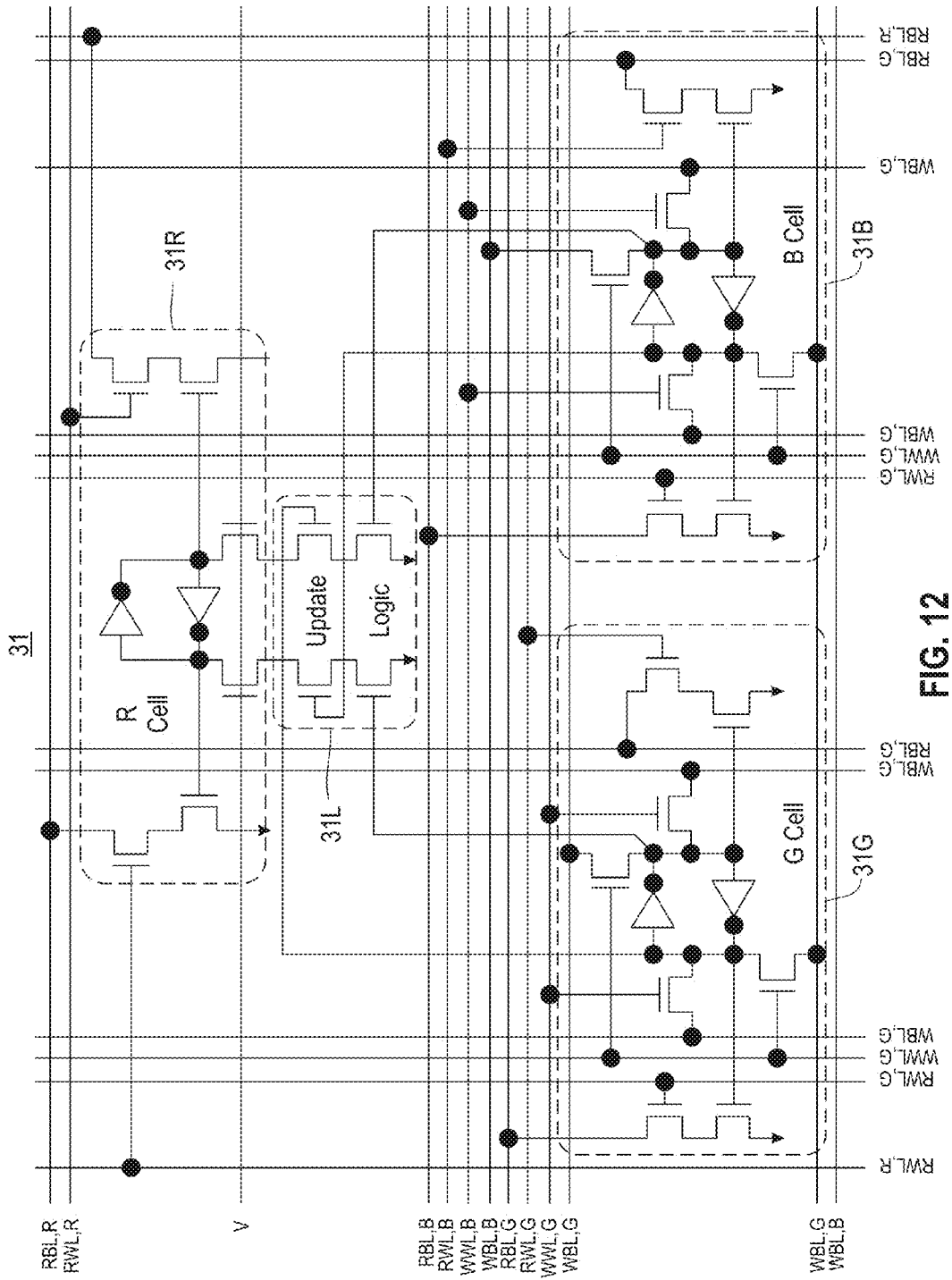
FIG. 12 shows a diagram of a static random access memory (SRAM)-based electronic synapse, in accordance with an embodiment of the invention.
Figure 13:
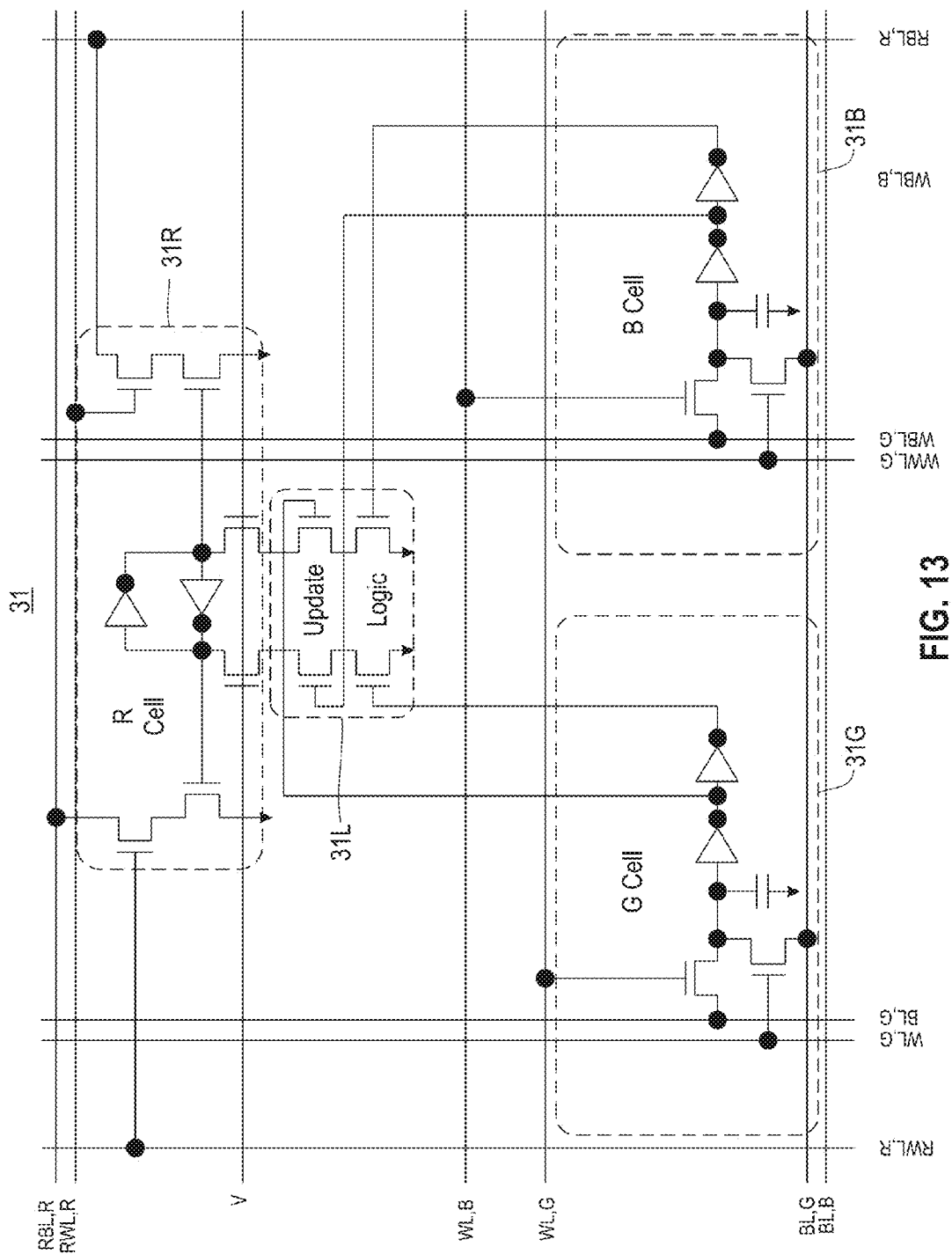
FIG. 13 shows a diagram of a dynamic random access memory (DRAM)-based electronic synapse, in accordance with an embodiment of the invention.

In one implementation, parallel word lines (horizontal) and bits lines (vertical) are used to access the memory cells. Each memory cell has a read word line, read bit line, a write word line and write bit line. In one example, the update logic 31L implements a logical exclusive or (XOR) combination of the B and G memory cell meta information, to update the R memory cell state of the synapse. The synapse cell 31 provides reinforcement learning with SRAM and DRAM implementation. Referring to FIG. 12, in an SRAM-based RGB cell implementation, each SRAM cell 31 is transposable (can be accessed by peripheral circuits in either rows or columns). Referring to FIG. 13, in a SRAM and DRAM-based implementation, data in DRAM memory elements decays over time to a base state. A clocking signal is used to clock the operation of the memory cells in the cross-bar array. The memory cells can be accessed synchronously or asynchronously.

When the pre-synaptic neuron fires and then the post-synaptic neuron fires, the synapse is set. When the post-synaptic neuron fires and the pre-synaptic neuron fires, the synapse is reset, and if a reward (value) signal occurs within a time window, STDP-Set or Reset is applied.

Electronic reinforcement of learning synapses further comprises: reading R rows in parallel, reading and setting G columns in parallel, resetting G rows in parallel, reading and setting B rows in parallel, setting B columns in parallel, estimating a number of set bits on R rows and columns, and implementing/providing a global value signal and setting and resetting all $N^2$ R bits, in parallel, in the cross-bar array when a reward signal arrives.

Figure 14:
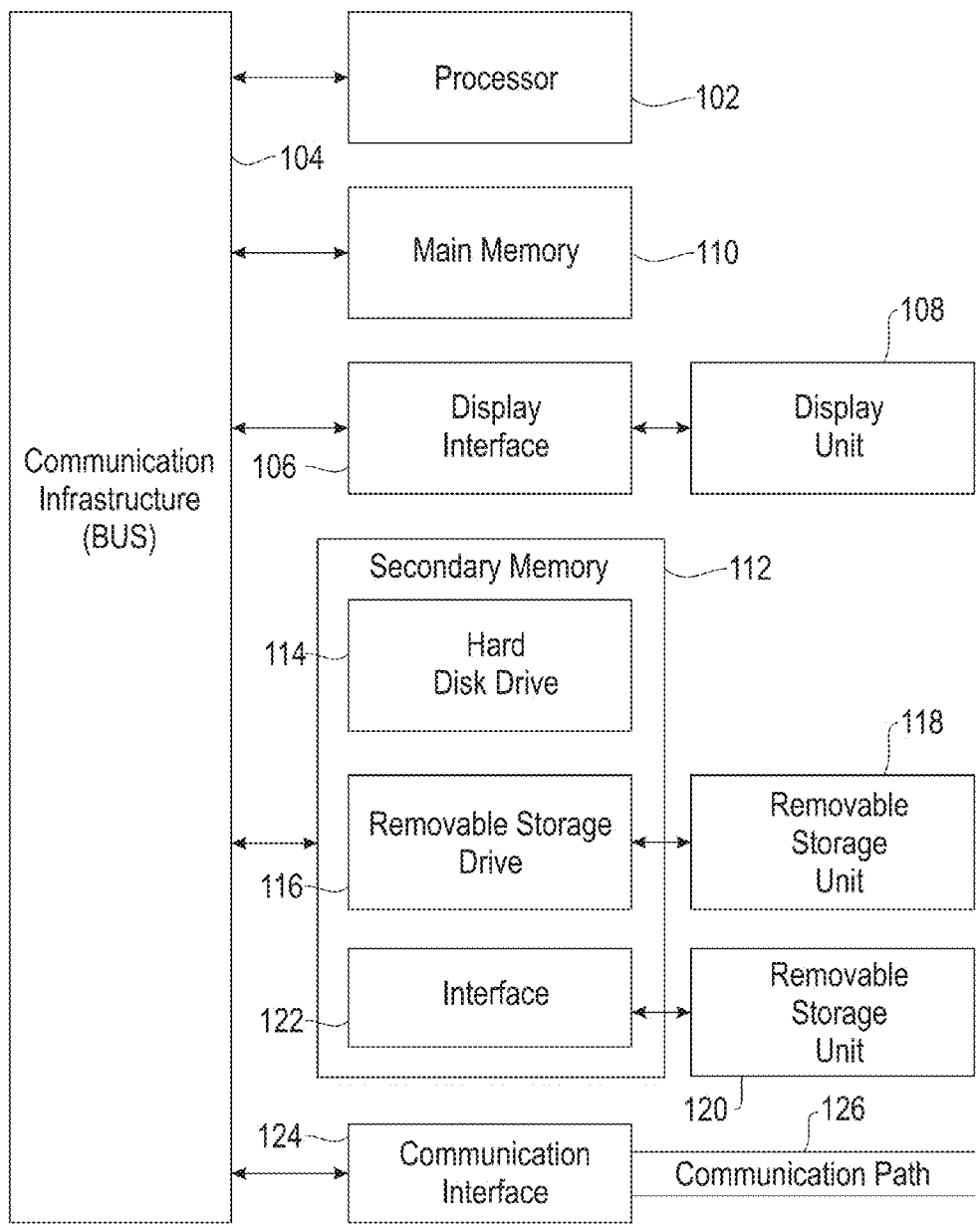
FIG. 14 shows a high level block diagram of an information processing system useful for implementing one embodiment of the present invention.

FIG. 14 is a high level block diagram showing an information processing system 100 useful for implementing one embodiment of the present invention. The computer system includes one or more processors, such as processor 102. The processor 102 is connected to a communication infrastructure 104 (e.g., a communications bus, cross-over bar, or network).

The computer system can include a display interface 106 that forwards graphics, text, and other data from the communication infrastructure 104 (or from a frame buffer not shown) for display on a display unit 108. The computer system also includes a main memory 110, preferably random access memory (RAM), and may also include a secondary memory 112. The secondary memory 112 may include, for example, a hard disk drive 114 and/or a removable storage drive 116, representing, for example, a floppy disk drive, a magnetic tape drive, or an optical disk drive. The removable storage drive 116 reads from and/or writes to a removable storage unit 118 in a manner well known to those having ordinary skill in the art. Removable storage unit 118 represents, for example, a floppy disk, a compact disc, a magnetic tape, or an optical disk, etc. which is read by and written to by removable storage drive 116. As will be appreciated, the removable storage unit 118 includes a computer readable medium having stored therein computer software and/or data.

In alternative embodiments, the secondary memory 112 may include other similar means for allowing computer programs or other instructions to be loaded into the computer system. Such means may include, for example, a removable storage unit 120 and an interface 122. Examples of such means may include a program package and package interface (such as that found in video game devices), a removable memory chip (such as an EPROM, or PROM) and associated socket, and other removable storage units 120 and interfaces 122 which allow software and data to be transferred from the removable storage unit 120 to the computer system.

The computer system may also include a communications interface 124. Communications interface 124 allows software and data to be transferred between the computer system and external devices. Examples of communications interface 124 may include a modem, a network interface (such as an Ethernet card), a communications port, or a PCMCIA slot and card, etc. Software and data transferred via communications interface 124 are in the form of signals which may be, for example, electronic, electromagnetic, optical, or other signals capable of being received by communications interface 124. These signals are provided to communications interface 124 via a communications path (i.e., channel) 126. This communications path 126 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 110 and secondary memory 112, removable storage drive 116, and a hard disk installed in hard disk drive 114.

Computer programs (also called computer control logic) are stored in main memory 110 and/or secondary memory 112. Computer programs may also be received via communications interface 124. Such computer programs, when run, enable the computer system to perform the features of the present invention as discussed herein. In particular, the computer programs, when run, enable the processor 102 to perform the features of the computer system. Accordingly, such computer programs represent controllers of the computer system.

From the above description, it can be seen that the present invention provides a system, computer program product, and method for implementing the embodiments of the invention. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
   an electronic synapse configured for interconnecting a pre-synaptic electronic neuron and a post-synaptic electronic neuron, the electronic synapse comprising:
   a first memory element maintaining a first bit for reading, wherein the first bit represents a state of the electronic synapse;
   additional memory elements maintaining meta information used for updating the state of the electronic synapse, wherein the meta information includes a second bit and a third bit for setting and resetting, respectively, the state of the electronic synapse for reinforcement learning based on a learning rule; and an update module configured for:
reading the meta information from said additional memory elements in response to an update signal for reinforcement learning; and
updating the state of the electronic synapse in the first memory element based on the meta information in response to the update signal;
wherein the meta information is based on a pre-synaptic neuron spiking signal and a post-synaptic neuron spiking signal of the pre-synaptic neuron and the post-synaptic neuron, respectively; and
wherein the state of the electronic synapse is set and reset based on the meta information.

2. The apparatus of claim 1, wherein the update module is configured for updating the state of the electronic synapse based on the meta information, in response to a delayed update signal for reinforcement learning based on a learning rule.

3. The apparatus of claim 2, wherein:
the update module is configured for updating the state of the electronic synapse based on electronic reinforcement learning such that the electronic synapse is updated based on spike-timing dependent plasticity learning rule;
the meta information comprises a first data value and a second data value corresponding to setting and resetting the state of the electronic synapse, respectively; and
the update module is further configured for updating the state of the electronic synapse based on an exclusive or of the first data value and the second data value.

4. The apparatus of claim 2, wherein:
the update module is configured for updating the electronic synapse such that:
in response to the pre-synaptic neuron spiking signal, the state of the electronic synapse is updated by a read signal sent from the pre-synaptic neuron to the post-synaptic neuron via the electronic synapse;
in response to the pre-synaptic neuron spiking signal and then the post-synaptic neuron spiking signal, the state of the electronic synapse is updated such that the electronic synapse is set according to learning rules; and
in response to the post-synaptic neuron spiking signal and then the pre-synaptic neuron spiking signal, the state of the electronic synapse is updated wherein the electronic synapse is reset according learning rules.

5. The apparatus of claim 2, wherein:
the update module is configured for updating the electronic synapse such that, if an update signal is received within a time window:
in response to the pre-synaptic neuron spiking signal, the state of the electronic synapse is updated by a read signal sent from the pre-synaptic neuron to the post-synaptic neuron via the electronic synapse;
in response to the pre-synaptic neuron spiking signal and then the post-synaptic neuron spiking signal, the state of the electronic synapse is updated wherein the electronic synapse is set according to learning rules; and
in response to the post-synaptic neuron spiking signal and then the pre-synaptic neuron spiking signal, the state of the electronic synapse is updated wherein the electronic synapse is reset according to learning rules.

6. The electronic synapse device of claim 5, wherein the electronic synapse comprises a 6-terminal device wherein two terminals are for reading, two terminals are for setting and two terminals are for resetting.

7. The apparatus of claim 1, wherein:
the electronic synapse is configured for interconnecting an axon of a pre-synaptic electronic neuron and a dendrite of a post-synaptic electronic neuron.

8. The apparatus of claim 1, wherein the electronic synapse further comprises multiple axon paths transverse to multiple dendrite paths forming an array of junctions, such that each memory element resides on the junctions on a diagonal of the array.

9. A system, comprising:
a plurality of electronic neurons;
a cross-bar array configured to interconnect the plurality of electronic neurons, the cross-bar array comprising:
a plurality of axons and a plurality of dendrites such that the axons and dendrites are transverse to one another; and
multiple electronic synapses, wherein each electronic synapse is at a cross-point junction of the cross-bar array coupled between a dendrite and an axon, each electronic synapse configured for interconnecting a pre-synaptic electronic neuron and a post-synaptic electronic neuron;
wherein each electronic synapse comprises:
a first memory element maintaining a first bit for reading, wherein the first bit represents a state of the electronic synapse;
additional memory elements maintaining meta information used for updating the state of the electronic synapse, wherein the meta information includes a second bit and a third bit for setting and resetting, respectively, the state of the electronic synapse for reinforcement learning based on a learning rule; and
an update module configured for:
reading the meta information from said additional memory elements in response to an update signal for reinforcement learning; and
updating the state of the electronic synapse in the first memory element based on the meta information in response to the update signal;
wherein the meta information is based on a pre-synaptic neuron spiking signal and a post-synaptic neuron spiking signal of the pre-synaptic neuron and the post-synaptic neuron, respectively; and
wherein the state of the electronic synapse is set and reset based on the meta information.

10. The system of claim 9, wherein the electronic synapses are asynchronously operable in parallel.

11. The system of claim 9, wherein electronic synapse states are programmed according to reinforcement learning based on delayed update signals.

12. The system of claim 11, wherein:
the update module of each electronic synapse is configured for updating the electronic synapse such that:
in response to the pre-synaptic neuron spiking signal, the state of the electronic synapse is updated by a read signal sent from the pre-synaptic neuron to the post-synaptic neuron via the electronic synapse;
in response to the pre-synaptic neuron spiking signal and then the post-synaptic neuron spiking signal, the state of the electronic synapse is updated such that the electronic synapse is set according to learning rules; and in response to the post-synaptic neuron spiking signal and then the pre-synaptic neuron spiking signal, the state of the electronic synapse is updated wherein the electronic synapse is reset according learning rules.

13. The system of claim 9, wherein:
the update module of each electronic synapse is configured for updating the electronic synapse based on reinforcement learning such that the electronic synapse is updated based on spike-timing dependent plasticity in response to an update signal;
the meta information of each electronic synapse comprises a first data value and a second data value corresponding to setting and resetting the state of the electronic synapse, respectively; and
the update module of each electronic synapse is further configured for updating the state of the electronic synapse based on an exclusive or of the first data value and the second data value of the electronic synapse.

14. The system of claim 9, wherein each electronic synapse further comprises multiple axon paths transverse to multiple dendrite paths forming an array of junctions, such that each memory element resides on the junctions on a diagonal of the array.

15. The system of claim 12, wherein each electronic synapse comprises:
three memory elements configured for maintaining information; and
three axon paths transverse to three dendrite paths forming a 3×3 array of 9 junctions, such that the three memory elements reside on the junctions on a diagonal of the array, providing an R bit for reading, a G bit for re-setting, and a B bit for setting.

16. The system of claim 15, wherein:
the cross-bar array comprises a plurality of cross-point junctions with multiple electronic synapses;
each electronic synapse is configured for electronic reinforcement learning for:
reading a first plurality of rows in parallel;
reading and setting a first plurality of columns in parallel;
resetting a second plurality of rows in parallel;
reading and setting a third plurality of rows in parallel;
setting a second plurality of columns in parallel;
estimating a number of set bits on said first plurality of rows and a third plurality of columns; and
providing a global value signal and setting and resetting all R bits for reading in the cross-bar array when a reward signal arrives.

17. The system of claim 16, wherein each electronic synapse comprises a 6-terminal device with two terminals for reading, two terminals for setting and two terminals for resetting.

18. The system of claim 14, wherein each electronic synapse comprises static random access memory (SRAM)-based memory elements.

19. The system of claim 14, wherein each electronic synapse comprises dynamic random access memory (DRAM)-based memory elements.

20. The system of claim 9, wherein each electronic synapse is configured for interconnecting an axon of a pre-synaptic electronic neuron and a dendrite of a post-synaptic electronic neuron.

21. A non-transitory computer program product comprising:
a computer usable medium having computer readable program code embodied therewith for execution on a computer;
the computer readable program code configured to update the state of an electronic synapse based on meta information, in response to a delayed update signal for reinforcement learning based on a learning rule;
wherein the electronic synapse is configured for interconnecting a pre-synaptic electronic neuron and a post-synaptic electronic neuron, the electronic synapse comprising:
a first memory element maintaining a first bit for reading, wherein the first bit represents a state of the electronic synapse;
additional memory elements maintaining meta information used for updating the state of the electronic synapse, wherein the meta information includes a second bit and a third bit for setting and resetting, respectively, the state of the electronic synapse for reinforcement learning based on a learning rule; and
an update module configured for:
reading the meta information from said additional memory elements in response to an update signal for reinforcement learning; and
updating the state of the electronic synapse in the first memory element based on the meta information in response to the update signal;
wherein the meta information is based on a pre-synaptic neuron spiking signal and a post-synaptic neuron spiking signal of the pre-synaptic neuron and the post-synaptic neuron, respectively; and
wherein the state of the electronic synapse is set and reset based on the meta information.

22. The computer program product of claim 21, wherein the computer readable program code configured to:
update the state of the electronic synapse based on electronic reinforcement learning such that the electronic synapse is updated based on spike-timing dependent plasticity learning rule;
wherein the meta information comprises a first data value and a second data value corresponding to setting and resetting the state of the electronic synapse, respectively; and
wherein the state of the electronic synapse is updated based on an exclusive or of the first data value and the second data value.

23. The computer program product of claim 21, wherein the computer readable program code configured to update the electronic synapse such that:
in response to the pre-synaptic neuron spiking signal, the state of the electronic synapse is updated by a read signal sent from the pre-synaptic neuron to the post-synaptic neuron via the electronic synapse;
in response to the pre-synaptic neuron spiking signal and then the post-synaptic neuron spiking signal, the state of the electronic synapse is updated such that the electronic synapse is set according to learning rules; and
in response to the post-synaptic neuron spiking signal and then the pre-synaptic neuron spiking signal, the state of the electronic synapse is updated wherein the electronic synapse is reset according to learning rules.

24. The computer program product of claim 21, wherein the computer readable program code configured to update the electronic synapse such that if an update signal is received within a time window:
in response to the pre-synaptic neuron spiking signal, the state of the electronic synapse is updated by a read signal sent from the pre-synaptic neuron to the post-synaptic neuron via the electronic synapse;

in response to the pre-synaptic neuron spiking signal and then the post-synaptic neuron spiking signal, the state of the electronic synapse is updated wherein the electronic synapse is set according to learning rules; and in response to the post-synaptic neuron spiking signal and then the pre-synaptic neuron spiking signal, the state of the electronic synapse is updated wherein the electronic synapse is reset according to learning rules.

25. The computer program product of claim 21, wherein:

the electronic synapse comprises a 6-terminal device wherein two terminals are for reading, two terminals are for setting and two terminals are for resetting; and the electronic synapse is configured for interconnecting an axon of a pre-synaptic electronic neuron and a dendrite of a post-synaptic electronic neuron.

* * * * *